United States Patent
Song (10) Patent No.: US 8,498,130 B2
(45) Date of Patent: Jul. 30, 2013

(54) SOLID STATE DRIVE, STRUCTURE FOR SUPPORTING SOLID STATE DRIVES AND SCALABLE INFORMATION PROCESSING SYSTEM INCLUDING A PLURALITY OF SOLID STATE DRIVES

(75) Inventor: Il-Jong Song, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 567 days.

(21) Appl. No.: 12/754,747

(22) Filed: Apr. 6, 2010

(65) Prior Publication Data

US 2010/0259882 A1    Oct. 14, 2010

(30) Foreign Application Priority Data

Apr. 10, 2009    (KR) .................. 10-2009-0031198

(51) Int. Cl.
*H05K 1/16*    (2006.01)
(52) U.S. Cl.
USPC ............ 361/766; 361/748; 361/760; 361/761

(58) Field of Classification Search
USPC .................. 361/766, 748, 760, 761, 737
See application file for complete search history.

(56) References Cited

U.S. PATENT DOCUMENTS

| 6,137,185 A * | 10/2000 | Ishino et al. .................. 257/786 |
| 6,309,912 B1 | 10/2001 | Chiou et al. |
| 2006/0227524 A1* | 10/2006 | Hsu .............................. 361/796 |
| 2010/0185830 A1* | 7/2010 | Asnaashari et al. .......... 711/206 |

FOREIGN PATENT DOCUMENTS

| KR | 100299304 B1 | 6/2001 |
| KR | 10-2007-0023319 A | 2/2007 |
| KR | 1020070037939 A | 4/2007 |

* cited by examiner

*Primary Examiner* — Timothy Thompson
*Assistant Examiner* — Andargie M Aychillhum
(74) *Attorney, Agent, or Firm* — Volentine & Whitt, PLLC (57) ABSTRACT

A solid state drive includes a printed circuit board, at least one memory and a controller. The at least one memory stores data. The at least one memory is embedded in the substrate of the printed circuit board. The controller controls the at least one memory to perform a write operation or a read operation. The controller is also embedded in the substrate of the printed circuit board.

19 Claims, 5 Drawing Sheets

SOLID STATE DRIVE, STRUCTURE FOR SUPPORTING SOLID STATE DRIVES AND SCALABLE INFORMATION PROCESSING SYSTEM INCLUDING A PLURALITY OF SOLID STATE DRIVES

PRIORITY STATEMENT

This application claims priority under 35 USC §119 to Korean Patent Application No. 2009-0031198, filed on Apr. 10, 2009, in the Korean Intellectual Property Office (KIPO).

BACKGROUND

1. Technical Field

The present inventive concept relates to solid state drives, support structures for supporting solid state drives and information processing systems including solid state drives.

2. Description of the Related Art

A hard disk drive (HDD) is typically used as a data storage mechanism of an electronic device. Recently, however, solid state drives (SSD) having flash memories (e.g., NAND-type flash memories or NOR-type flash memories) are being used instead of hard disk drives as the data storage mechanisms of electronic devices.

A solid state drive is advantageous over a hard disk drive because a solid state drive does not include a mechanical device, such as a motor, and almost no heat and no noise are produced in a solid state drive. In addition, a solid state drive has advantages of fast access rate, high density, and high stability. Furthermore, data is transferred much faster in a solid state drive than in a hard disk drive.

SUMMARY

According to one aspect of the inventive concept, there is provided a solid state drive that includes a printed circuit board having a substrate and circuitry printed on at least one surface of the substrate, at least one memory embedded in the substrate of the printed circuit board, and a controller also embedded in the substrate of the printed circuit board. The controller is operative to control the at least one memory to perform a write operation or a read operation.

According to another aspect of the inventive concept, there is provided in combination at least one solid state drive, a main circuit board, and support structure, wherein the support structure comprises a solid state drive casing disposed on the main circuit board and defining a plurality of slots, and a cover that covers the solid state drive casing. The slots are each sized and shaped to receive a respective solid state drive in an orientation in which the drive is parallel to the main circuit board. The solid state drive(s) is/are respectively received in the slots of the casing and thereby extend(s) parallel to the main circuit board. The cover extends over each solid state drive received in a respective one of the slots defined by the casing.

According to another aspect of the inventive concept, there is provided an information processing system that includes a main circuit board, a host processor disposed on and electrically coupled to the main circuit board, a plurality of solid state drives, and support structure supporting the drives on the main circuit board. Each of the solid state drives comprises a printed circuit board, at least one memory embedded in the substrate of the printed circuit board, and a controller also embedded in the substrate of the printed circuit board. The controller is operative to control the at least one memory to perform a write operation or a read operation. The support structure comprises a solid state drive casing disposed on the main circuit board and defining a plurality of slots, and a cover that covers the solid state drive casing. The slots are each sized and shaped to receive a respective solid state drive in an orientation in which the drive is parallel to the main circuit board, and the solid state drives are respectively received in the slots. Thus, the solid state drives extend parallel to the main circuit board and are covered by the cover of the casing. Also, each of the solid state drives is electrically coupled to the host processor via the main circuit board.

BRIEF DESCRIPTION OF THE DRAWINGS

The inventive concept will be more clearly understood from the following detailed description of preferred embodiments thereof made with reference to the accompanying drawings.

DETAILED DESCRIPTION OF THE PREFERRED EMBODIMENTS

Figure 1:
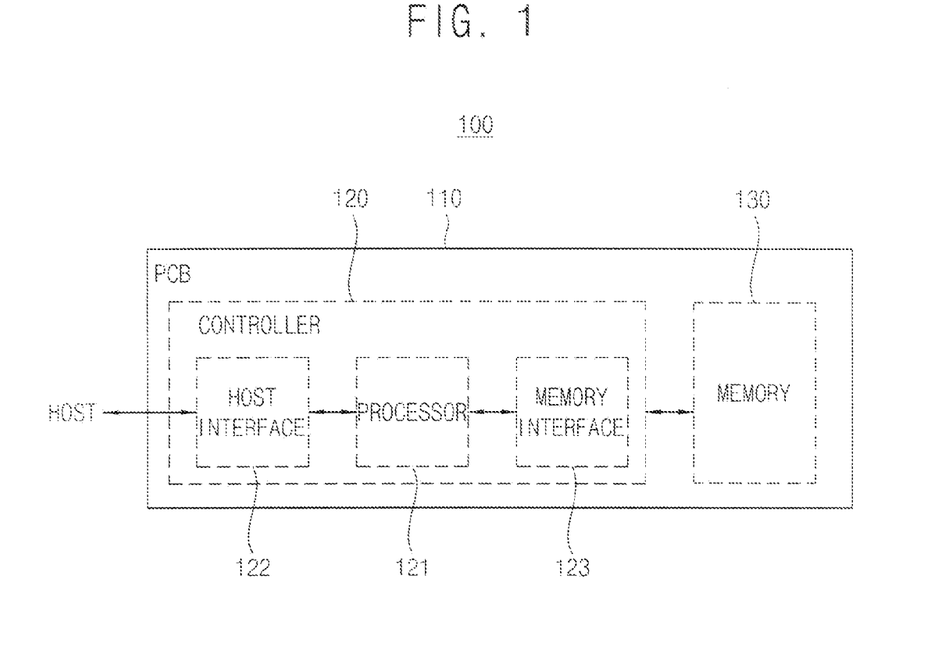
FIG. 1 is a block diagram of an embodiment of a solid state drive according to the inventive concept.
Figure 2:
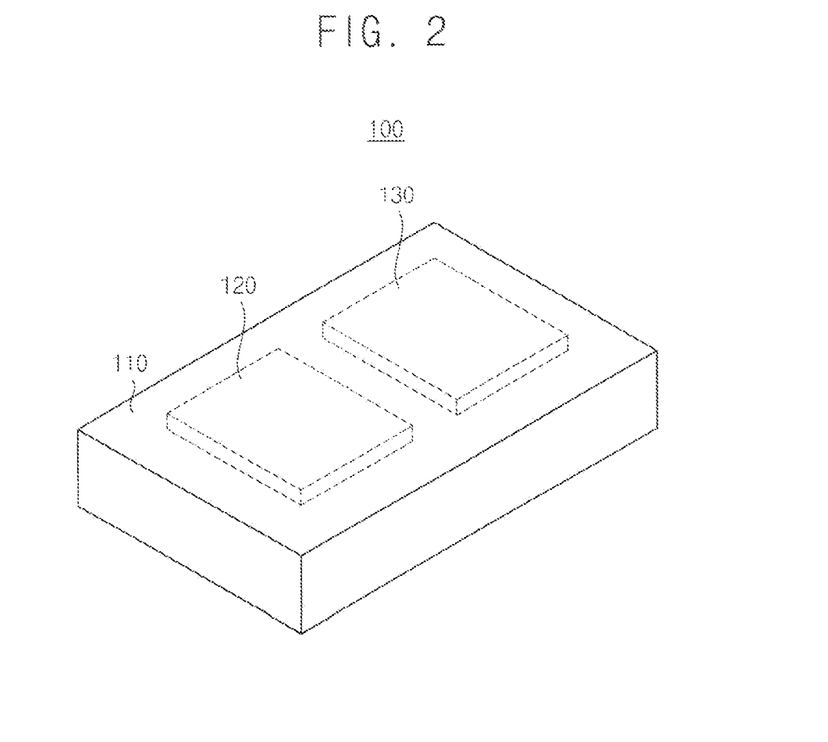
FIG. 2 is a perspective view of the solid state drive of FIG. 1.
Figure 3:
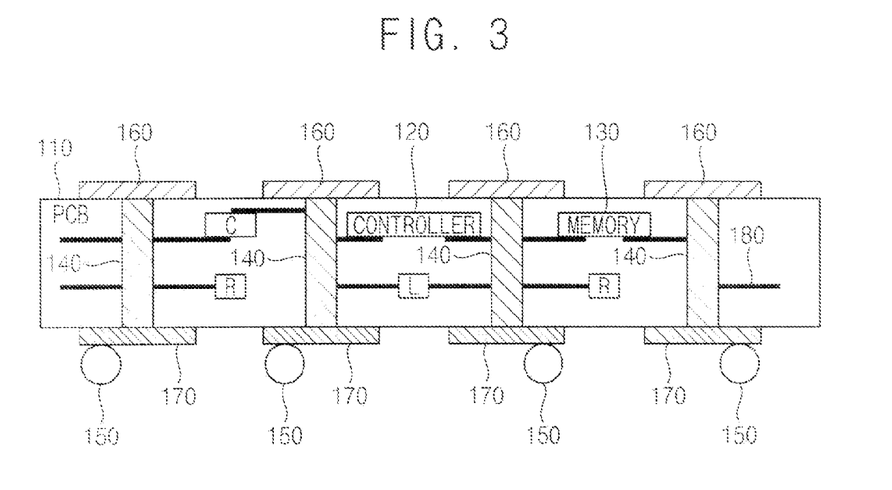
FIG. 3 is a cross-sectional view of the solid state drive of FIG. 1.

FIGS. 1-3 illustrate a solid state drive according to the inventive concept.

Referring to FIGS. 1 and 2, the solid state drive 100 includes a printed circuit board 110 including a substrate, a controller 120, and at least one memory 130 configured to store data.

The controller 120 is embedded in the substrate of the printed circuit board 110. The controller 120 is configured to control the memory 130 to perform a write operation or a read operation in response to a request from an external device, such as a host device. The controller 120 may include a processor 121, a host interface 122 and a memory interface 123. The processor 121 may communicate with the host device through the host interface 122, and may communicate with the memory 130 through the memory interface 123. The processor 121 may receive a command, an address and/or data through the host interface 122 from the host device, and may control the memory 130 to perform the write operation or the read operation through the memory interface 123 based on the command, the address and/or the data.

The host interface 122 may be controlled by the processor 121 to transfer the command, the address and/or the data between the processor 121 and the host device. Also, the host interface 122 may be a serial advanced technology attachment (SATA) interface, a parallel advanced technology attachment (PATA) interface, or the like.

The memory interface 123 may be controlled by the processor 121 to transfer the command, the address and/or the data between the processor 121 and the memory 130. The memory interface 123 may transmit control signals to the memory 130 and based on which the memory 130 performs the write operation or the read operation.

The controller 120 may further include an internal memory that temporarily stores the data transferred between the host device and the memory 130. The internal memory may store an operating system (OS) program for the processor 121. In this regard, the internal memory may be a volatile memory, such as a static random access memory (SRAM) or a dynamic random access memory (DRAM) which operates at a high speed and is randomly accessed.

The memory 130 is embedded in the printed circuit board 110. The memory 130 may be controlled by the controller 120 to store the data transferred from the host device or to output the stored data. The memory 130 may be a nonvolatile memory, such as a NAND flash memory, a NOR flash memory, or an electrically erasable programmable read-only memory (EEPROM). Furthermore, although FIG. 1 shows the solid state drive 100 as having only one memory 130, the solid state drive 100 may include a plurality of memories.

As described above, the controller 120 and the memory 130 are embedded in the printed circuit board 110. In this respect, the controller 120 and the memory 130 may each be in the form of a die embedded in the printed circuit board 110. Alternatively, the controller 120 and the memory 130 may each be in package form. In any case, the solid state drive 100 may have a small volume because the controller 120 and the memory 130 are embedded in the printed circuit board 110.

Referring to FIG. 3, the printed circuit board 110 of the solid state drive 100 may further include a plurality of vias 140 and a plurality of pads 160. The printed circuit board 110 may also have signals lines 180 therein. In this case, the substrate of the printed circuit board 110 may be a multi-layered structure in which the signal lines 180 are formed on respective surfaces of the layers.

The vias 140 each extend through the substrate of the printed circuit board 110. Also, the vias 140 may be electrically coupled to the controller 120 and the memory 130 through signal lines 180 in the printed circuit board 110.

The solid state drive 100 may also include balls 150 disposed on a lower surface of the printed circuit board 110. Alternatively, however, the balls 150 may be disposed on an upper surface of the printed circuit board 110. Each ball 150 may be a solder ball. The balls 150 may be arrayed in the pattern of a grid. In any case, the balls 150 are electrically coupled to the vias 140. In the case in which the solid state drive 100 is mounted directly on a main (circuit) board of an information processing system, e.g., a mother board of a computer, signals transmitted from a host device may be received by the controller 120 and/or the memory 130 through the main board, the balls 150, the vias 140 and the signal lines 180.

The plurality of pads 160 constitute the circuit of the printed circuit board 110 and are disposed on the side of substrate of the printed circuit board 110 opposite that on which the balls 150 are disposed. Thus, the pads 160 are disposed at the upper surface of the printed circuit board 110 in the present embodiment. The pads 160 are electrically coupled to the balls 150 by the vias 140. The number of pads 160 may correspond to the number of balls 150, in which case the pads 160 are electrically coupled to the balls 150, respectively, by the vias 140. As shown in FIG. 3, the balls 150 in this embodiment are offset horizontally (i.e., in a direction parallel to the plane of the substrate) from the vias 140. Alternatively, though, each ball 150 may be vertically aligned (i.e., in a direction perpendicular to the plane of the substrate) with a respective via 140 and a respective pad 160. Furthermore, the plurality of pads 160 may be coupled to the balls of another solid state drive stacked thereon. Accordingly, a plurality of solid state drives embodied according to the inventive concept may be readily stacked one atop the other as electrically coupled to one another.

The printed circuit board 110 of the solid state drive 100 may further include, as part of its circuit, a plurality of pads 170 interposed between the balls 150 and the vias 140, respectively. In this case, the pads 170 electrically couple the balls 150 to the vias 140.

The solid state drive 100 may further include at least one passive component R, L and/or C embedded in the substrate of the printed circuit board 110. For example, the solid state drive 100 may include at least one resistor R, at least one inductor L and at least one capacitor C.

As described above, a solid state drive 100 according to the inventive concept may have a small volume because the controller 120 and the memory 130 are embedded in (the substrate of) the printed circuit board 110. Furthermore, the inventive concept also can increase the data storage capacity of an electronic device, such as a computer, because sold state drives according to the inventive concept are readily stackable.

Figure 4A:
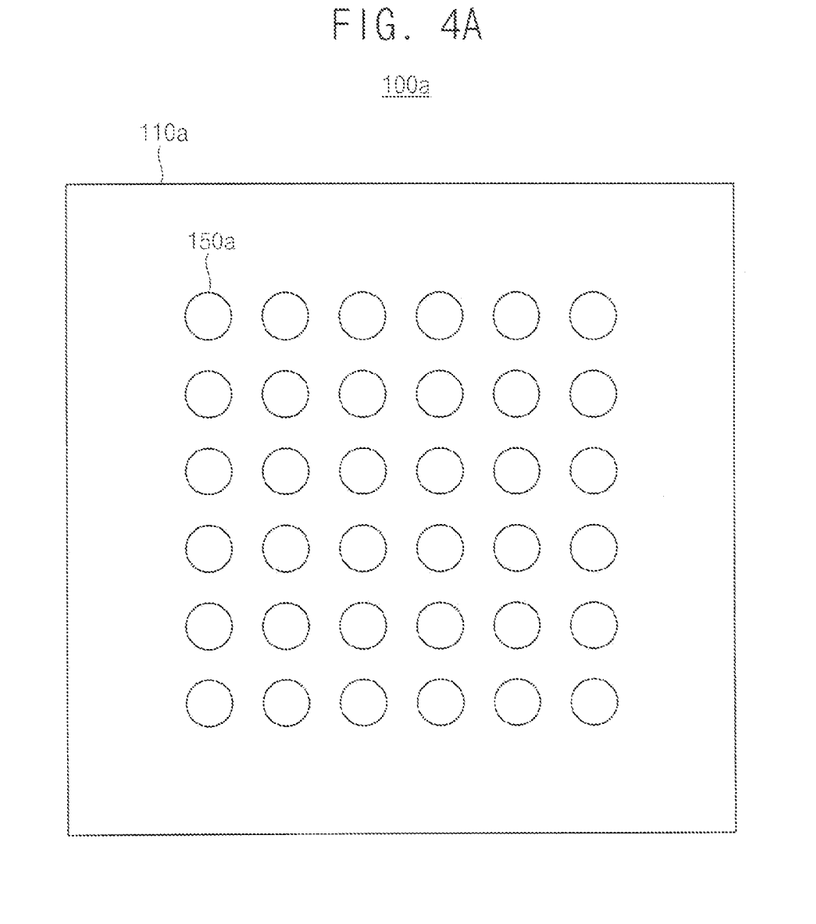
FIGS. 4A and 4B are plan views of examples of a ball grid arrays, respectively, of a solid state drive according to the inventive concept.
Figure 4B:
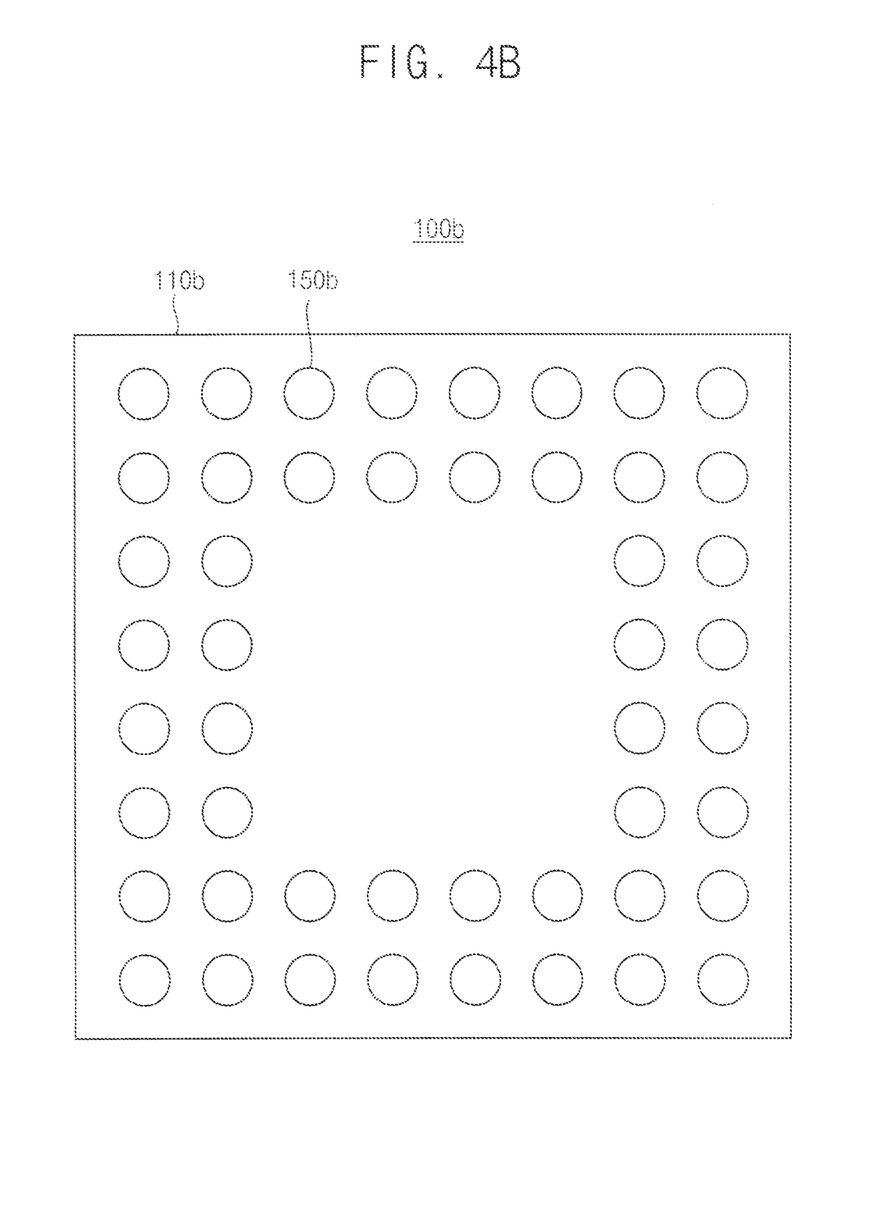

FIGS. 4A and 4B respectively illustrate ball grid arrays of examples of solid state drives according to the inventive concept.

Referring to FIGS. 4A and 4B, a ball grid array of a solid state drive 100a or 100b according to the inventive concept consists of a plurality of balls 150a or 150b of solder, for example, disposed on the lower surface of the printed circuit board 110a or 110b of the solid state drive 100a or 100b. The number and pattern of the balls 150a or 150b may be base on a standard or on the specifications of an interface between the solid state drive 100a or 100b and a host device. In the examples shown in FIGS. 4A and 4B, the balls 150a or 150b are arrayed along a grid. More specifically, in the example of FIG. 4A, the balls 150a are regularly spaced along each of the rows and columns of a grid. On the other hand, in the example of FIG. 4B, the balls 150b occupy the rows and columns which extend at the outer periphery of a grid.

As was mentioned above, the ball grid array may be directly coupled to a main (circuit) board of an information processing system. In this case, the information processing system would not require a cable for connecting the solid state drive 100a or 100b, for example, with the main board. Likewise, when one or more other similar solid state drives according to the inventive concept is/are stacked on the solid state drive 100a or 100b, the stacked solid state drive(s) are electrically coupled to the main board through the solid state drive 100a or 100b without a cable between the stacked solid state drive(s) and the main board. Accordingly, a plurality of solid state drives may be readily stacked on the main board, thereby providing the computer with a large storage capacity.

Figure 5:
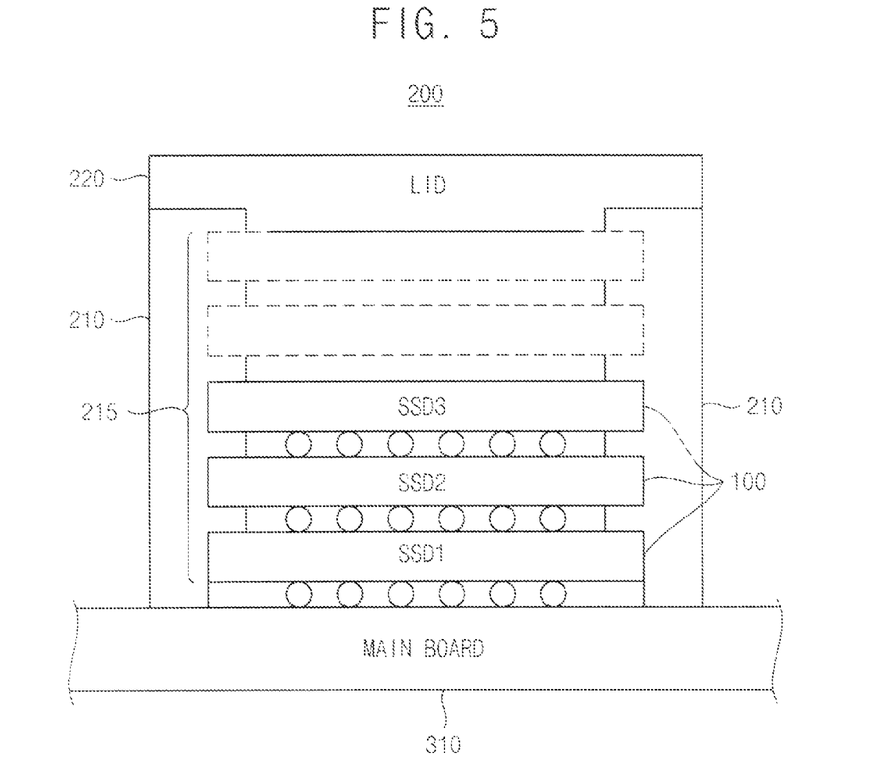
FIG. 5 is a front view of structure for supporting solid state drives according to the inventive concept.

FIG. 5 illustrates support structure for supporting a stack of solid state drives according to an aspect of the inventive concept.

Referring to FIG. 5, support structure 200 for supporting solid states drives 100 includes a solid state drive casing 210 and a cover 220. The solid state drive casing 210 is disposed on a main (circuit) board 310. In this respect, the solid state drive casing 210 may be integrally formed with the main board 310. The solid state drive casing 210 has supports that define one or more slots 215 each configured (i.e., is sized and shaped) to receive a solid state drive 100 oriented with its PCB parallel to the main board 310. The support structure also allows a respective dummy solid state drive to be inserted into each slot which does not hold a solid state drive 100. Such a dummy solid state drive has substantially the same size and thickness as the solid state drive 100. In the embodiment illustrated in FIG. 5, the solid state drive casing 210 has five slots 215, the bottom three of which are occupied by solid state drives 100, respectively, and the top two of which are occupied by dummy solid state drives (illustrated by dashed lines). Also, although the figure shows only two supports, the solid state drive casing 210 may have four supports each at the corner of a rectangle having approximately the same size and shape of the PCBs of the solid state drive(s) to be supported. Accordingly, the solid states drives 100 may be readily stacked.

Specifically, the solid states drives 100 can be sequentially inserted into the slots 215 beginning at the slot closest to the main board 310. In this case, the solid state drive SSD1 received in the slot closest to the main board 310 is directly coupled to the main board 310 via the balls (ball grid array) of the solid state drive SSD1, i.e., without a cable. The balls of a second solid state drive SSD2, received in the next slot up, will also be electrically coupled to the main board 310 without a cable. That is, the second solid state drive SSD2 will be coupled to the pads of the first solid state drive SSD1. Thus, the second solid state drive SSD2 can communicate with a host device through signal lines of the main board 310 (printed circuits on a surface of the substrate of the main board), and the balls, vias, and pads of the first solid state drive SSD1. Similarly, a third solid state drive SSD3 may be stacked on the second solid state drive SSD2 and thus, will be electrically coupled to the main board 310 without a cable.

The cover 220 is disposed on and may be removable from the top of the solid state drive casing 210. In one embodiment, the support structure 200 has a coupling means for detachably coupling the cover 220 to the solid state drive casing 210. The coupling means may be a clip, a screw, or the like. In another embodiment, an opening is formed in one of the solid state drive casing 210 and the cover 220, and a protrusion having a cross-sectional area corresponding to that of the opening is formed in the other of the solid state drive casing 210 and the cover 220. The protrusion is received in the opening such that the cover 220 is thereby coupled to the solid state drive casing 210. Furthermore, the cover 220 may serve to fix the at least one solid state drive in the plurality of slots of the solid state drive casing 210. For example, the cover 220 may have an extension that presses against the underlying solid state drive 100 thereby urging that drive into engagement with the surface of the solid state drive casing 210 that defines the bottom of the slot. Thus force is, in turn, transmitted through the balls of the solid state drive to the underlying solid state drive(s) and thereby also urging these drives into tighter engagement with the solid state drive casing 210.

Figure 6:
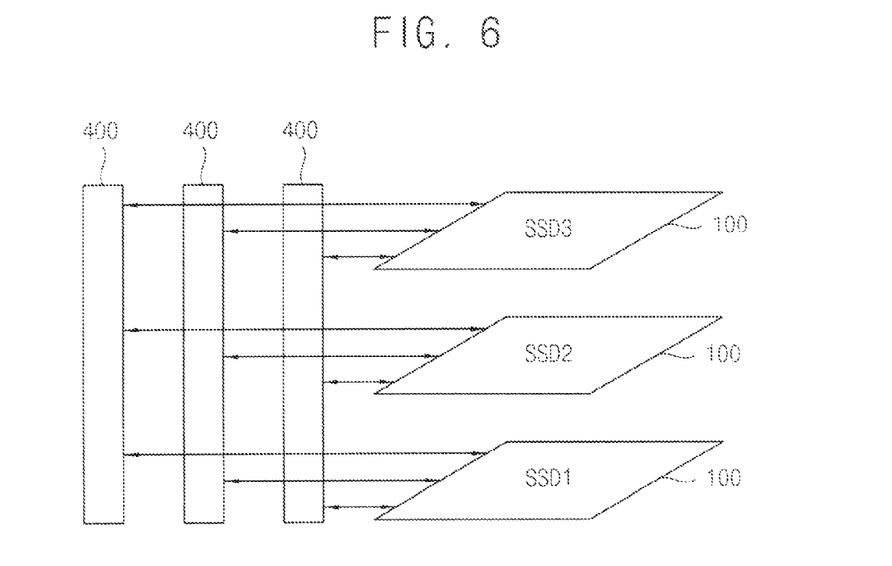
FIG. 6 is a conceptual diagram illustrating connections of the solid state drives illustrated in FIG. 5.

FIG. 6 is a diagram illustrating a coupling of solid state drives using the support structure 200 of FIG. 5.

Referring to FIG. 6, each solid state drive 100 can be considered as being electrically coupled to a main board through a plurality of signal paths 400. Each signal path 400 may be constituted by respective ones of the balls, vias, and pads of the solid state drives 100. For example, a controller and a memory of a first solid state drive SSD1 communicate with a main board through signal paths 400 constituted by a plurality of balls and a plurality of vias of the first solid state drive SSD1. A controller and a memory of a second solid state drive SSD2 communicate with the main board through signal paths 400 constituted by balls, vias and pads of the first solid state drive SSD1 as well as balls and vias of the second solid state drive SSD2. A controller and a memory of a third solid state drive SSD3 communicates with the main board through signal paths 400 constituted by balls, vias and pads of the first and second solid state drives SSD1 and SSD2 as wells as balls and vias of the third solid state drive SSD3. The signal paths 400 may be compatible with a serial advanced technology attachment (SATA) interface, a parallel advanced technology attachment (PATA) interface, or the like.

Figure 7:
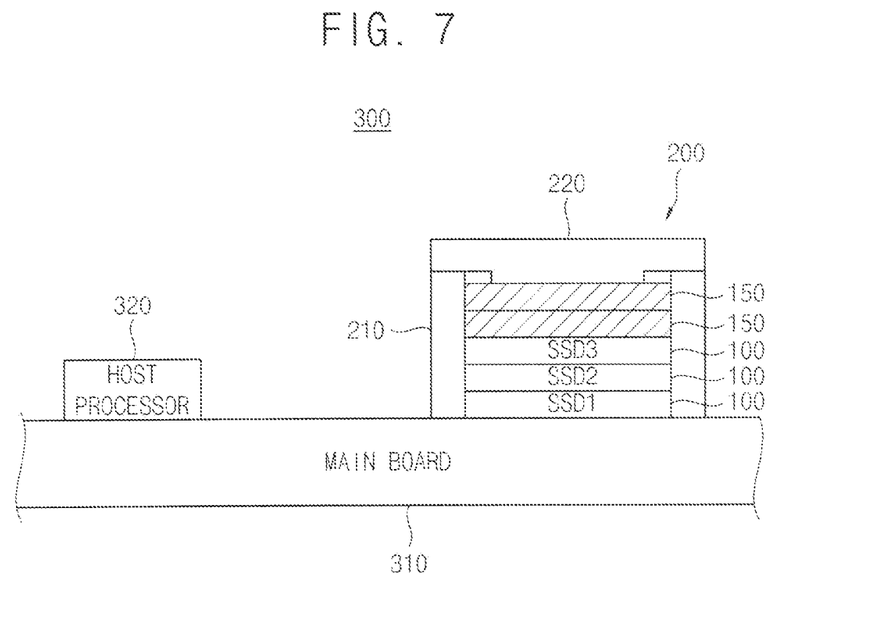
FIG. 7 is a schematic diagram of an information processing system according to the inventive concept.

FIG. 7 illustrates an information processing system according to the inventive concept. The information processing system 300 may be that of a personal computer, a notebook computer, a mobile phone, a smart phone, a digital camera, a handheld computer, a music player, a gaming machine, a personal digital assistant (PDA), or a portable multimedia player (PMP).

Referring to FIG. 7, the information processing system 300 includes a main (circuit) board 310, a host processor 320, support structure 200 for supporting solid state drives, and at least one solid state drive 100 supported by the support structure 200 and electrically coupled to the main board 310.

The host processor 320 is mounted on the main board 310. The host processor 320 writes or reads data on or from the solid state drives 100 through signal lines of the main board 310.

The support structure 200 is disposed on the main board 310. The support structure 200 is similar to that shown in and described with reference to FIG. 5 and therefore, will not be described again in further detail. Similarly, the solid state drives 100 are similar to those shown in and described with reference to 1-3 and 6 and therefore, will not be described again in further detail.

Figure 8:
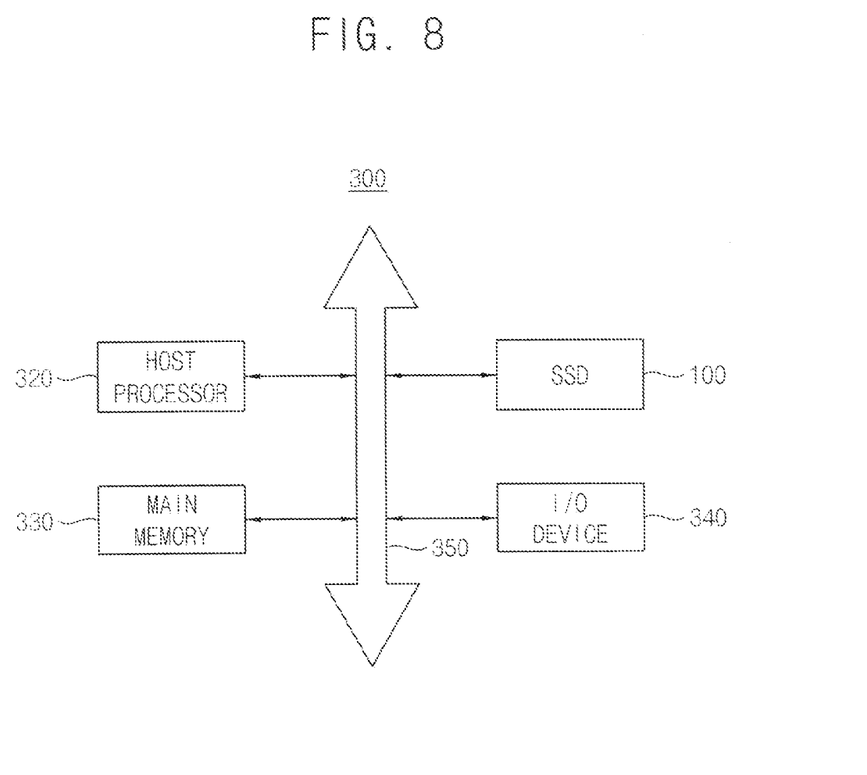
FIG. 8 is a block diagram of the system of FIG. 7.

FIG. 8 is a block diagram of the information processing system 300 of FIG. 7.

Referring to FIG. 8, in addition to the host processor 320 and solid state drive(s) 100, the information processing system 300 includes a main memory 330, at least one input/output device 340 and a bus 350. The host processor 320 may perform various computing functions, such as executing specific software for performing specific calculations or tasks. To this end, the host processor 320 may be a microprocessor, a central process unit (CPU), or the like. The host processor 320 is coupled to the main memory 330 via the bus 350. The bus 350 may be an address bus, a control bus, or a data bus. The computer 300 may also have an expansion bus, such as a peripheral-component-interconnect (PCI) bus, to which the host processor 320 is coupled. The main memory 330 may be a dynamic random access memory (DRAM), a static random access memory (SRAM), or a non-volatile memory, such as an erasable programmable read-only memory (EPROM), an electrically erasable programmable read-only memory (EEPROM), or the like. The input/output device 340 may be a keyboard, a mouse, a printer, or a display that controls or is controlled by the host processor 320. The host processor 320 is also coupled to the solid state drive(s) 100 via the bus 350. The host processor 320 is configured to write or read data on or from the solid state drive(s) 100. The information processing system 300 may also include an auxiliary data storage device, such as a floppy disk drive, a compact disk read-only memory (CD-ROM) drive, or a hard disk drive.

As described above, a solid state drive embodied according to the inventive concept may have a small volume because electronic components thereof are embedded in its printed circuit board. In addition, structure for supporting the solid state drives and information processing systems comprising at least one of the solid state drives do not require cables for connecting the solid state drive(s) to a main board or host processor because the solid state drive(s) have a ball grid array. Furthermore, an information processing system according to the inventive concept may have a relatively great or readily expandable data storage capacity because the solid state drives are readily stackable. That is, an information processing system is easily scalable by employing solid state drives according to an aspect of the inventive concept.

Finally, embodiments of the inventive concept have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A solid state drive comprising:
   a printed circuit board having a substrate including opposite upper and lower major surfaces;
   at least one memory configured to store data, the at least one memory being located between the upper and lower major surfaces of the substrate of the printed circuit board as embedded in the substrate of the printed circuit board; and
   a controller operative to control the at least one memory to perform a write operation or a read operation, the controller being located between the upper and lower major surfaces of the substrate of the printed circuit board as embedded in the substrate of the printed circuit board so as to be surrounded by the mass of the substrate, wherein the controller includes: a host interface configured to communicate with a host device; a memory interface being electrically coupled to the at least one memory; and a processor in communication with the host interface, and with the memory interface, whereby the host processor can communicate with both the at least one memory and with a host device connected to the solid state drive via the host interface.

2. The solid state drive of claim 1, further comprising:
   a plurality of vias extending through the substrate of the printed circuit board, the plurality of vias being electrically coupled to the at least one memory and the controller.

3. The solid state drive of claim 2, further comprising:
   a plurality of balls disposed on one side of the printed circuit board, the plurality of balls being electrically coupled to the plurality of vias.

4. The solid state drive of claim 3, wherein the plurality of balls constitute a ball grid array in which the balls are laid out along a grid.

5. The solid state drive of claim 3,
   wherein the printed circuit board also has a plurality of pads on one of the major surfaces of the substrate at a side of the printed circuit board opposite that at which the balls are disposed, the pads being electrically coupled to the balls through the vias.

6. The solid state drive of claim 5, wherein each of the balls is disposed along substantially the same line, extending perpendicular to the substrate, as respective ones of the vias and pads.

7. The solid state drive of claim 2, wherein the printed circuit board also has signal lines running through the substrate thereof between the upper and lower major surfaces of the substrate as surrounded firmly in the mass of the substrate, the signal lines electrically coupling at least one of the vias to the at least one memory and at least one of the vias to the controller.

8. The solid state drive of claim 7, further comprising:
   a plurality of balls disposed on one side of the printed circuit board, the plurality of balls being electrically coupled to the plurality of vias.

9. The solid state drive of claim 8, wherein the printed circuit board also has a plurality of pads on one of the major surfaces of the substrate at a side of the printed circuit board opposite that at which the balls are disposed, the pads being electrically coupled to the balls through the vias.

10. The solid state drive of claim 7, wherein the at least one memory and the controller each are in the form of a die or a package embedded in the substrate of the printed circuit board.

11. The solid state drive of claim 1, further comprising:
    at least one passive electric component located between the upper and lower surfaces of the substrate of the printed circuit board as embedded in the substrate of the printed circuit board.

12. The combination of at least one solid state drive, a main circuit board, and support structure, wherein the support structure comprises a solid state drive casing disposed on the main circuit board and defining a plurality of slots, and a cover that covers the solid state drive casing, the slots each being sized and shaped to receive a respective solid state drive in an orientation in which the drive is parallel to the main circuit board, each said at least one solid state drive received in a respective one of the slots of the casing and thereby extending parallel to the main circuit board, and the cover extending over each solid state drive received in a respective one of the slots defined by the casing.

13. The combination of claim 12, wherein the at least one solid state drive comprises a plurality of solid state drives received in the slots of the casing, respectively.

14. The combination of claim 13, wherein each said at least one solid state drives comprises a printed circuit board having a substrate,
    at least one memory configured to store data, the at least one memory being embedded in the substrate of the printed circuit board, and
    a controller operative to control the at least one memory to perform a write operation or a read operation, the controller being embedded in the substrate of the printed circuit board.

15. The combination of claim 14, wherein each said at least one solid state drives further comprises:
    a plurality of vias extending through the substrate of the printed circuit board, the plurality of vias being electrically coupled to the at least one memory and the controller, and
    a plurality of balls disposed on one side of the printed circuit board, the plurality of balls being electrically coupled to the plurality of vias, and
    the slots of the casing of the support structure are disposed one above the other over the main circuit board,
    the plurality of solid state drives include a first solid stated drive received in the slot of the casing which, of all of the slots, is located closest to the main circuit board,
    the balls of the first solid state drive are electrically coupled to the main circuit board, and
    each of the solid state drives which is received in another of the slots is electrically coupled to the main circuit board through the balls thereof, and through the vias and the balls of each solid state drive disposed below it in the casing.

16. The combination of claim 12 and further comprising at least one dummy solid state drive, wherein each said at least one dummy solid state drive is received in a respective one of the slots.

17. The combination of claim 12, wherein the support structure is integral with the main circuit board.

18. An information processing system, comprising:
a main circuit board;
a host processor disposed on and electrically coupled to the main circuit board;
a plurality of solid state drives, each of the solid state drives comprising:
a printed circuit board having a substrate,
at least one memory configured to store data, the at least one memory being embedded in the substrate of the printed circuit board, and
a controller operative to control the at least one memory to perform a write operation or a read operation, the controller being embedded in the substrate of the printed circuit board; and
support structure comprising:
a solid state drive casing disposed on the main circuit board and defining a plurality of slots, and
a cover that covers the solid state drive casing, the slots each being sized and shaped to receive a respective solid state drive in an orientation in which the drive is parallel to the main circuit board, each of the solid state drives received in a respective one of the slots of the casing and thereby extending parallel to the main circuit board, each of the solid state drives being electrically coupled to the host processor via the main circuit board, and the cover extending over the solid state drives respectively received in the slots defined by the casing.

19. The information processing system of claim 18, wherein each of the solid state drives further comprises:
a plurality of vias extending through the substrate of the printed circuit board, the plurality of vias being electrically coupled to the at least one memory and the controller, and
a plurality of balls disposed on one side of the printed circuit board, the plurality of balls being electrically coupled to the plurality of vias,
the slots of the casing of the support structure are disposed one above the other over the main circuit board,
the plurality of solid state drives include a first solid stated drive received in the slot of the casing which, of all of the slots, is located closest to the main circuit board,
the balls of the first solid state drive are electrically coupled to the main circuit board, and
each of the solid state drives which is received in another of the slots is electrically coupled to the main circuit board through the balls thereof, and through the vias and the balls of each solid state drive disposed below it in the casing.

* * * * *